United States Patent
Kim et al.

(10) Patent No.: US 10,192,006 B2
(45) Date of Patent: Jan. 29, 2019

(54) SIMULATION CONSTRUCTION METHOD FOR THE MEASUREMENT OF CONTROL ROD INSERTION TIME

(71) Applicant: KEPCO ENGINEERING & CONSTRUCTION COMPANY, INC., Yongin-si, Gyeonggi-do (KR)

(72) Inventors: Kyoung Ryun Kim, Daejeon (KR); Cheol Shin Lee, Daejeon (KR)

(73) Assignee: KEPCO ENGINEERING & CONSTRUCTION COMPANY, INC., Gyeonggi-Do (KR)

( * ) Notice: Subject to any disclaimer, the term of this patent is extended or adjusted under 35 U.S.C. 154(b) by 370 days.

(21) Appl. No.: 14/411,361

(22) PCT Filed: Dec. 24, 2013

(86) PCT No.: PCT/KR2013/012064
§ 371 (c)(1),
(2) Date: Dec. 24, 2014

(87) PCT Pub. No.: WO2014/104696
PCT Pub. Date: Jul. 3, 2014

(65) Prior Publication Data
US 2015/0294042 A1    Oct. 15, 2015

(30) Foreign Application Priority Data
Dec. 27, 2012 (KR) .................. 10-2012-0155251

(51) Int. Cl.
*G06F 17/50* (2006.01)
*G21C 17/00* (2006.01)
(Continued)

(52) U.S. Cl.
CPC .......... *G06F 17/5009* (2013.01); *G06F 17/10* (2013.01); *G21C 7/08* (2013.01);
(Continued)

(58) Field of Classification Search
None
See application file for complete search history.

(56) References Cited

U.S. PATENT DOCUMENTS 4,337,118 A * 6/1982 Sakurai .................. G21D 3/10
                                                            376/210
5,217,678 A * 6/1993 Fukasawa ............... G21C 7/08
                                                            376/237
(Continued)

FOREIGN PATENT DOCUMENTS

JP   S54-120388 A    9/1979
JP   57-23893 B2     2/1982
(Continued)

OTHER PUBLICATIONS

IAEA-TECDOC-813, "Advances in control assembly materials for water reactors", 1993, pp. 1-203.*
(Continued)

*Primary Examiner* — Kibrom K Gebresilassie
(74) *Attorney, Agent, or Firm* — Nixon Peabody LLP; Jeffrey L. Costellia

(57) ABSTRACT

Provided is a method of the simulation construction for measurement of the control rod insertion time including a three-dimensional modeling operation of an inside wall of the nuclear reactor, a control rod, etc; a flow field configuration operation wherein the flow field is differentially configured by a variable grid system comprising variable cells which change the configuration and by an aligned grid system comprising fixed cells which maintains the configuration; a calculation operation of simulation estimated value for the insertion time by analyzing the thermal-hydraulic phenomenon using the three-dimensional CFD; and a cell change operation, wherein an error between the estimated value and the actual value is verified whether the error lies within the reference range, and, when the error exceeds the (Continued)

reference range, the size of the variable cell and/or of the size of the fixed cell is changed.

5 Claims, 4 Drawing Sheets

(51) Int. Cl.
*G21C 7/08* (2006.01)
*G06F 17/10* (2006.01)
*G21D 3/00* (2006.01)

(52) U.S. Cl.
CPC ............ *G21C 17/00* (2013.01); *G21D 3/001* (2013.01); *B01J 2208/00557* (2013.01); *B01J 2208/00584* (2013.01); *B01J 2208/00725* (2013.01); *B01J 2219/00081* (2013.01); *G06F 17/5018* (2013.01); *G21D 2003/002* (2013.01); *G21D 2003/005* (2013.01); *Y02E 30/39* (2013.01); *Y10S 585/922* (2013.01)

(56) References Cited

U.S. PATENT DOCUMENTS

| | | | | |
|---|---|---|---|---|
| 5,677,938 | A * | 10/1997 | Gassmann | G21C 7/02 376/237 |
| 5,818,892 | A * | 10/1998 | Rauch | G21C 7/12 376/215 |
| 6,473,481 | B1 * | 10/2002 | Ishii | G21C 7/16 15/1.7 |
| 6,824,305 | B1 * | 11/2004 | Boyd | G01K 17/00 374/15 |
| 6,959,269 | B1 * | 10/2005 | Welterlen | G06F 17/5018 703/2 |
| 8,010,326 | B2 * | 8/2011 | Senecal | G06T 17/20 703/1 |
| 8,163,158 | B2 * | 4/2012 | Newkirk | C25B 1/04 204/228.1 |
| 9,926,389 | B2 * | 3/2018 | Zimmerman | C08F 10/00 |
| 2007/0002997 | A1 | 1/2007 | Bolger et al. | |
| 2011/0182396 | A1 * | 7/2011 | Park | G21C 3/32 376/446 |
| 2012/0206128 | A1 * | 8/2012 | Marshall | G21C 17/022 324/149 |
| 2015/0186735 | A1 * | 7/2015 | Yang | G06K 9/6267 382/104 |
| 2016/0042823 | A1 * | 2/2016 | Goreaud | G21D 3/001 703/2 |
| 2016/0333120 | A1 * | 11/2016 | Zimmerman | C08F 10/00 |

FOREIGN PATENT DOCUMENTS

| | | |
|---|---|---|
| JP | 11-237490 A | 8/1999 |
| JP | 2004-226245 A | 8/2004 |
| KR | 10-0568562 B1 | 4/2006 |
| KR | 10-0927124 B1 | 11/2009 |
| KR | 10-0957061 B1 | 5/2010 |
| KR | 10-2011-0014399 A | 2/2011 |
| KR | 10-1022161 B1 | 3/2011 |
| KR | 2012-0083756 A | 7/2012 |
| WO | WO 2011/093843 A2 | 8/2011 |

OTHER PUBLICATIONS

English translation of Japaneses Applcation No. 2004-226245A, pp. 1-7.*
Y. Koide, M. nakagawa, N. Fukushi, "Analysis of Dynamic INsertion of Control of BWR under Seismic Excitation", pp. 1132-1139, 2008.*
Notice of Allowance of Korean Patent Application No. 10-2012-0155251 dated Jun. 2, 2014.
International Search Report and Written Opinion in PCT/KR2013/012064 dated Mar. 31, 2014.
Hofmann et al., "Computational Fluid Dynamic Analysis of a Guide Tube in a PWR," Nuclear Engineering and Design, Aug. 1, 2000, pp. 117-126, vol. 200, No. 1-2.
Yoon, et al. "Control Rod Drop Analysis by Finite Element Method Using Fluid-Structure Interaction for a Pressurized Water Reactor Power Plant," Nuclear Engineering and Design, Oct. 1, 2009, pp. 1857-1861, vol. 239, No. 10, Amsterdam, Netherlands.
Supplementary European Search Report, dated Jul. 14, 2016, issued in European Patent Application No. 13866973.4, 6 pages.
First Office Action, dated Jan. 25, 2016, issued in Chinese Patent Application No. 201380035313.4, 10 pages.

* cited by examiner

[Fig.1]
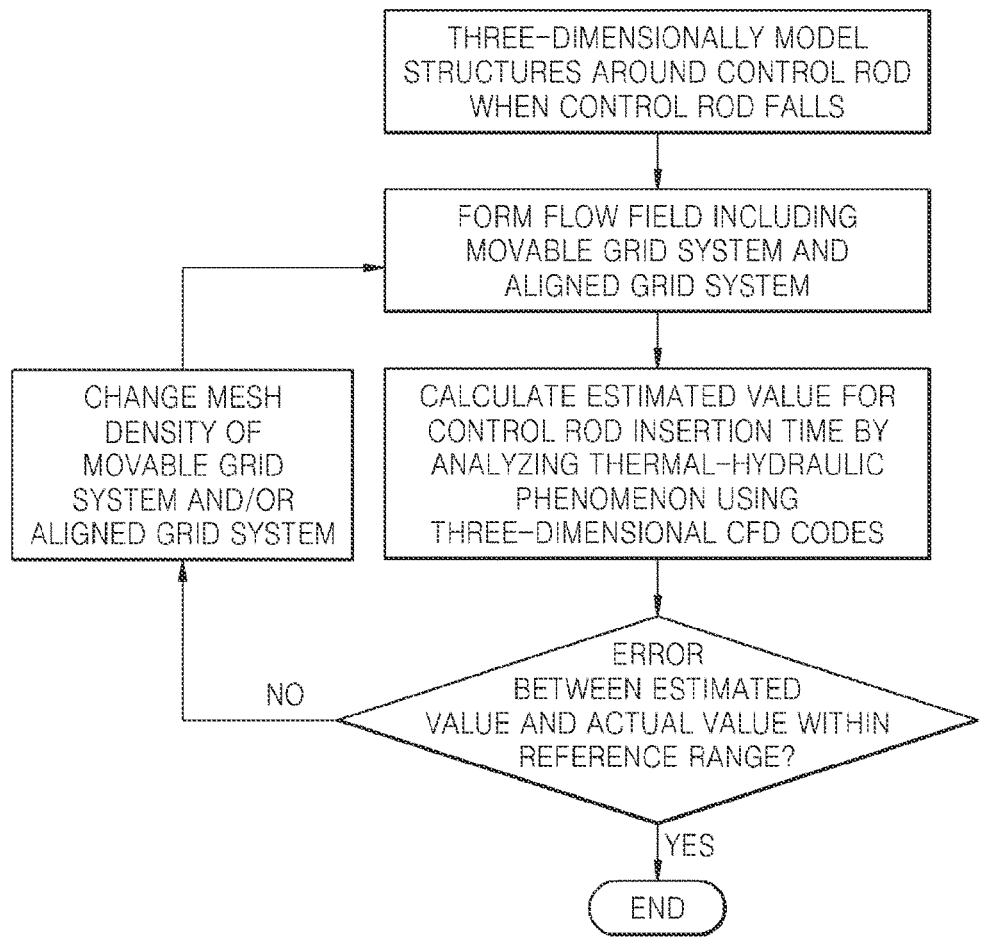

[Fig.2]
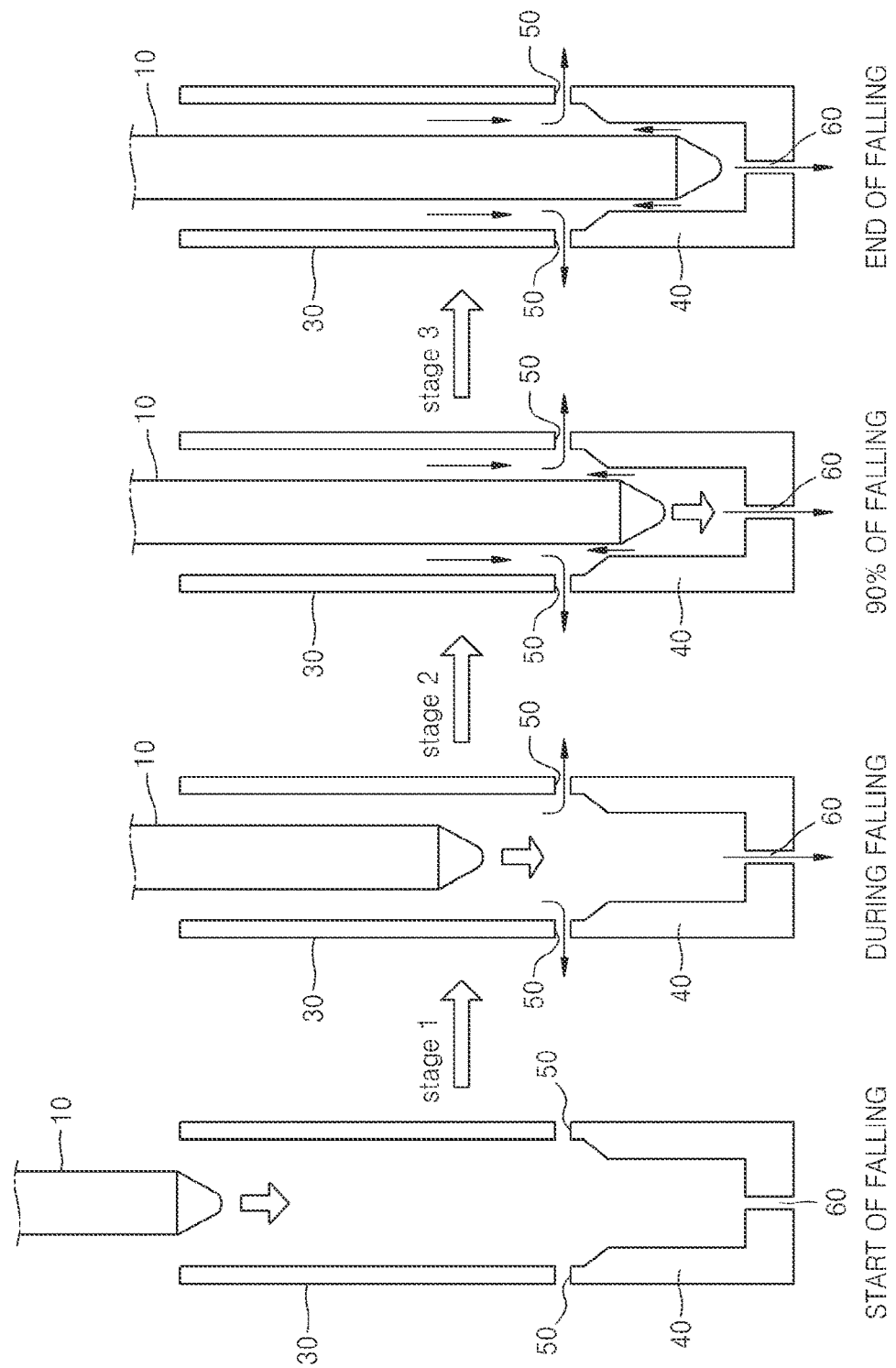

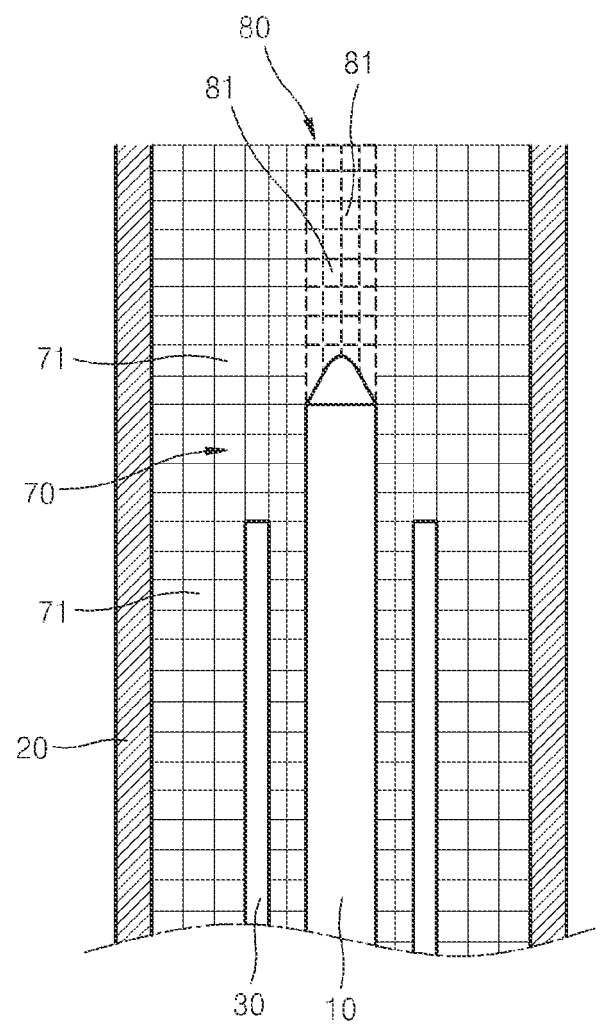
[Fig.3]

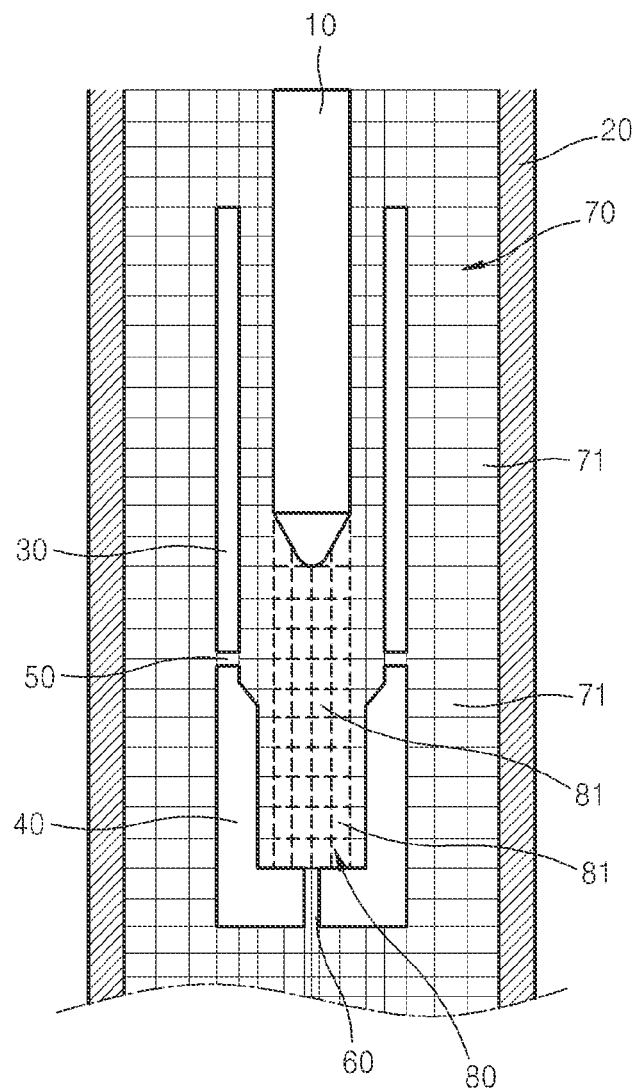

SIMULATION CONSTRUCTION METHOD FOR THE MEASUREMENT OF CONTROL ROD INSERTION TIME

CROSS REFERENCE TO RELATED APPLICATIONS

This application is the national stage of International Application No. PCT/KR2013/012064, filed Dec. 24, 2013, entitled, "Simulation Construction Method For The Measurement Of Control Rod Insertion Time," which claims the benefit of priority of Korean Patent Application No. 10-2012-0155251, filed Dec. 27, 2012, the contents of both of which are incorporated herein by reference in their entirety.

TECHNICAL FIELD

One or more embodiments of the present invention relate to a method of constructing a simulation to measure a control rod insertion time, and more particularly, to an evaluation methodology for the measurement of the insertion time of a control rod which freely falls down to the nuclear reactor core under gravity by use of the computational fluid dynamics (CFD). One or more embodiments of the present invention relate to a method of calculating a value similar to a real value of free-falling of a control rod in a nuclear power-plant considering the three-dimensional thermal hydraulic effect in a nuclear reactor.

BACKGROUND ART

A control rod is a core component with a function of controlling core reactivity by changing the number of neutrons in a core while inserting a control rod into the core and retracting a control rod out of the core. In other words, as a component used with a purpose of controlling and halting the power of a nuclear reactor, the control rod is moved up and down by a control rod drive mechanism installed on the top portion of the nuclear reactor. After receiving a fall signal from the control rod drive mechanism, the control rod freely falls down to the nuclear reactor core with the gravity. The insertion time of a control rod absolutely needs evaluation for the safe operation of a nuclear reactor and satisfaction of the allowance requirements.

A conventional control rod insertion time is calculated using one-dimensional codes. The one-dimensional codes consider factors such as hydraulic resistance of a fluid, friction, and weight of a control rod assembly, but have a drawback of a big calculation error due to no consideration of three-dimensional hydraulic effects occurring inside a guide tube for guiding the control rod. Therefore, the conventional control rod insertion time has been conservatively evaluated by applying the high uncertainly of a value bigger than a real design. Under these circumstances the control rod insertion time may be much larger than measured time during the actual operation of the nuclear reactor.

Since the control rod insertion time is used to perform the operation of the nuclear reactor and the safety analysis evaluation, a practical value needs to be deduced with elimination of exaggerated conservatism. To evaluate the control rod insertion time similar to the actually measured value in the nuclear reactor, the thermal-hydraulic phenomenon having a three-dimensional, spatial distribution of factors such as the control rod, the nuclear reactor, the guide tube, and an impact absorption tube needs to be taken into consideration.

DISCLOSURE OF INVENTION

Technical Problem

One or more embodiments of the present invention include a method of constructing a simulation to measure a control rod insertion time, by preparing a three-dimensional model for the free-falling time of the control rod with a real configuration for surrounding structures such as a nuclear reactor, a control rod, a guide tube, an impact absorption tube, and a drainage, and by simulating a three-dimensional thermal-hydraulic phenomenon using the computational fluid dynamics (CFD), thereby producing a value of the control rod insertion time that is similar to the time actually measured in the nuclear reactor.

Solution to Problem

According to one or more embodiments of the present invention, the simulation construction method for the measurement of control rod insertion time may include the three-dimensional modeling, when the control rod freely falls down to the core of the nuclear reactor by the gravity, of an inside wall of the nuclear reactor, the control rod accommodated into the nuclear reactor, the guide tube guiding the control rod, the impact absorption tube installed at the bottom of the guide tube with a diameter smaller than the diameter of the guide tube, the first flow hole located on the wall side of the guide tube, and the second flow hole located at the bottom of the impact absorption tube; the construction of the flow field by dividing the inside of the nuclear reactor into multiple number of cells; the construction of the flow field formed by a variable grid system with multiple number of changing cells where the configuration changes as the location of the control rod changes on the moving path of the control rod and by an aligned grid system with multiple number of fixed cells where the configuration is maintained regardless of the location change of the control rod; the calculation of the simulation estimated value for the insertion time until the control rod is inserted into the impact absorption tube by calculating the thermal-hydraulic phenomenon using the three-dimensional CFD codes; and the cell adjustment where the estimated value is compared with the actual value of the insertion time when the control rod actually falls inside the nuclear reactor, and the error between the estimated value and the actual value is verified if within an arbitrarily reference range, and, when the error exceeds the reference range, the size of the variable cell and/or the size of the fixed cell is changed.

The simulation construction method for the measurement of control rod insertion time may include the calculation of the hydraulic drag of the control rod caused by the water filling the nuclear reactor, when the control rod falls.

The simulation construction method for the measurement of control rod insertion time may include the consideration of the friction of the water and the control rod, and the weight of the control rod, when the control rod falls.

The simulation construction method for the measurement of control rod insertion time may include the establishment of the reference range in such a way that the estimated value and the actual value make an error of less than 5%.

The simulation construction method for the measurement of control rod insertion time may include the consideration of the thermal-hydraulic phenomenon in such a way that the pressure change, the temperature change, and the density change of the water around the control rod.

Advantageous Effects of Invention

As described above, according to the one or more of the above embodiments of the present invention, the simulation construction method for the measurement of the insertion time of the control rod may exhibit an effect that utilization of the CFD and the realization of the falling process of the control rod by considering the three-dimensional thermal-hydraulic characteristics may obtain the estimated insertion time of the control rod calculated by the simulation as a very approximate value for the actual value when the control rod actually falls inside the nuclear reactor.

By simulating the control rod insertion time as an approximate value for the actual value, the additional information for the drop speed of the control rod, the pressure distributions in the guide tube and the impact absorption tube, and the flow rates out of the first and second flow holes may be obtained to be utilized as useful information for design and operation of the nuclear reactor.

As described above, according to the one or more of the above embodiments of the present invention, the simulation construction method for the measurement of the insertion time of the control rod may exhibit an effect that the information obtained out of the present invention may be applied to design and operation of not only new but currently-operating nuclear reactors, and provide useful information for the operation of the nuclear reactor currently in operation.

BRIEF DESCRIPTION OF DRAWINGS

FIG. 1 is a flowchart of a simulation construction method according to an embodiment of the present invention;

FIG. 2 illustrates a falling process of a control rod; and

FIGS. 3 and 4 schematically illustrate a variable grid system and an aligned grid system according to the position of a control rod.

BEST MODE FOR CARRYING OUT THE INVENTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the values, to explain aspects of the present description. As used herein, the term "and/or" includes any and all combinations of one or more of the associated listed items.

Hereinafter, the present invention will be described in detail by explaining exemplary embodiments of the invention with reference to the attached drawings. In order to further clearly describe features of one of more embodiments of the present invention, well-known technologies are not particularly described herein.

A control rod begins free-falling toward a core of a nuclear reactor by gravity after receiving a falling signal from a control rod drive mechanism. The present invention relates to a method of constructing a simulation to measure a time from when the control rod begins free-falling until the control rod enters an impact absorption tube.

FIG. 1 is a flowchart of a simulation construction method according to an embodiment of the present invention. FIG. 2 illustrates a falling process of a control rod. FIGS. 3 and 4 schematically illustrate a variable grid system and an aligned grid system according to the position of a control rod.

Referring to FIG. 1, according to an embodiment of the present invention, the simulation construction method for measurement of the control rod insertion time may include a three-dimensional modeling operation for the geometric shape, a flow field forming operation, a simulation estimated value calculation operation, and a cell change operation.

The three-dimensional modeling operation may be the three-dimensional modeling of surrounding structures where a control rod 10 freely falls. According to the present embodiment, an inside wall 20 of a nuclear reactor, the control rod 10, a guide tube 30, an impact absorption tube 40, a first flow hole 50, and a second flow hole 60 may be modeled in three dimensions.

The nuclear reactor may accommodate the control rod 10, and the guide tube 30 may guide the control rod 10 when the control rod 10 freely falls. The control rod 10 falls downward along the guide tube 30. The impact absorption tube 40 may be installed at the bottom of the guide tube 30 and have a diameter smaller than the diameter of the guide tube 30.

The control rod 10, while the control rod 10 falls along the guide tube 30, may exhibit a rapid acceleration until the control rod 10 arrives at the impact absorption tube 40. At the time when the control rod 10 enters the impact absorption tube 40 the control rod 10 may experience an increase of the hydraulic drag and the drop speed of the control rod 10 decreases. In other words, since the diameter of the impact absorption tube 40 may be arranged as smaller than the diameter of the guide tube 30, the drop speed of the control rod 10 may decrease when the control rod 10 passes through the impact absorption tube 40.

The first flow hole 50 may be installed on the wall of the guide tube 30. When the control rod 10 falls along the guide tube 30, the control rod 10 may push the water filling inside of the guide tube 30, and the water may move to the outside of the guide tube 30 through the first flow hole 50. In other words, the water may fill the entire nuclear reactor and, when the control rod 10 falls, the water existing inside the guide tube 30 may move to the outside of the guide tube 30 through the first flow hole 50.

The second flow hole 60 may be installed at the bottom of the impact absorption tube 40. When the control rod 10 may fall further downward after entering the impact absorption tube 40, the water filling the inside of the impact absorption tube 40 may move to the outside through the second flow hole 60. In other words, the water may move to the outside of the impact absorption tube 40 through the second flow hole 60. The three-dimensional modeling operation may include the modeling of surrounding structures related with the control rod 10 in three dimensions while the control rod 10 falls.

A flow field may be formed. The flow field may include a variable grid system 80 and an aligned grid system 70.

The flow field may signify an area influenced by the falling of the control rod 10 while the control rod 10 falls inside of the nuclear reactor, and is constructed by dividing the inside of the nuclear reactor into multiple cells.

For the measurement of the insertion time of the control rod 10, a core area may be divided into many small cells. The small cells are defined as grids.

The variable grid system 80 may be a set of multiple cells having a shape that changes as the location of the control rod 10 changes on a path along which the control rod 10 passes. Each cell with a shape that changes as the location of the control rod 10 changes may be referred to as a variable cell 81. In other words, the variable grid system 80 is a set of the variable cells 81 which are arranged on the path along which the control rod 10 passes while the control rod 10 falls.

The variable grid system 80 may be generally obtained by performing calculations with changing the grid at every predetermined time step when a subject exists moving relatively to the flow field or the configuration of the flow field changes due to the influence of certain variables in the flow field.

In other words, according to the present embodiment, since the grid of a moving area where the control rod 10 falls as the control rod 10 falls toward the core due to the gravity, may change along with the control rod 10 as the time passes, the variable cell 81 may be configured as changing according to the location of the control rod 10.

According to the present embodiment, the variable grid system 80 may be arranged as illustrated in FIGS. 3 and 4.

FIG. 3 illustrates the top portion of the control rod 10, in which the variable grid system 80 that is affected according to a change in the position of the control rod 10 is configured from the point where the top portion of the control rod 10 is located before the fall to the point where the top portion of the control rod 10 is located after the fall. The variable grid system 80 is constructed in this range by use of the variable cell 81. FIG. 4 illustrates the bottom portion of the control rod 10, in which the path where the bottom portion of the control rod 10 passes as the control rod 10 falls is configured as the variable grid system 80.

The aligned grid system 70 may be configured by dividing the area in the flow field other than the variable grid system 80 into multiple cells. The aligned grid system may be aggregation set of multiple fixed cells 71 maintaining the configuration regardless of the location change of the control rod 10.

Each fixed cell 71 included in the aligned grid system 70 may have a rectangular shape to be regularly distributed. A non-aligned grid system, a term in contrast with the aligned grid system 70, conventionally refers to an irregular arrangement of non-aligned grids which have cells with a shape other than a rectangle; for example, a quadrangle without sides having a right angle, or a triangle. In the present embodiment, the aligned grid system 70 may be used for the calculation accuracy and the reduction in the calculation time, and the area where the control rod 10 moves may be configured by the variable grid system 80.

The simulation estimated value calculation operation may be an operation of calculating an insertion time until the control rod 10 is inserted into the impact absorption tube 40 by analyzing the thermal-hydraulic phenomenon by use of the three-dimensional computational fluid dynamics (CFD) codes.

The thermal-hydraulic phenomenon may indicate physical changes occurring around a subject when the subject falls and, according to an embodiment of the present invention, includes factors such as the pressure change, the temperature change, and the density change of the water around the control rod 10 while the control rod 10 falls down to the impact absorption tube 40.

The thermal-hydraulic phenomenon using the three-dimensional CFD codes may be analyzed in consideration of variable factors such as pressure, temperature and density of the water filling the nuclear reactor. Since the analysis method of the thermal-hydraulic phenomenon by use of the three-dimensional CFD codes is a well-known method, the analysis method will not be particularly described herein.

The cell configuration change operation may be performed to reduce an error range by changing the size of the variable grid cell 81 and/or the fixed cell 71 when an error between the estimated value and the actual value taken until the control rod 10 enters the impact absorption tube 40 in a real power plant after the control rod 10 begins to fall exceeds the error range.

The estimated value may be compared with the actual value for the insertion time when the control rod 10 falls in a real power plant. Then, it is determined whether an error between the estimated value and the actual value is within a certain reference range. According to an embodiment of the present invention, the reference range is set in such a way that the error between the estimated value and the actual value is less than 5%. When the reference range is set to exceed 5%, the evaluation result of the estimated value may be over-conservative, which is not desirable.

When the error exceeds the reference range, the change operation of the cell configuration may be performed to change the size of the variable cell 81 and/or the fixed cell 71. As used herein, the term "and/or" includes either a simultaneous size change of both the variable cell 81 and the fixed cell 71, or a change of a size of any selected one of either the variable cell 81 or the fixed cell 71.

An accurate estimated value may be calculated by optimizing the mesh density of the variable cell 81 included in the variable grid system 80 and/or the fixed cell 71 included in the aligned grid system 70, since the structures arranged around the control rod 10 are very complicated and elaborate when the control rod 10 falls.

According to an embodiment of the present invention, the simulation construction method for measurement of the control rod insertion time may additionally include the calculation operation of the hydraulic drag, the friction between the water and the control rod 10, and the consideration operation of the weight of the control rod 10.

The calculation operation of the hydraulic drag may consider the influence of the control rod 10 on the hydraulic drag, while the control rod 10 falls, due to the water filling inside the nuclear reactor, and may more accurately produce the estimated value by considering the actual drag by the water as a parameter in the estimation calculation, along with the simulation of the three-dimensional thermal-hydraulic phenomenon.

When the control rod 10 falls down by the gravity to the impact absorption tube 40, the water vertically rises along a narrow flow path formed by the guide tube 30 and the impact absorption tube 40. In such a case when the water vertically moves, the hydraulic drag may be obtained by using Darcy's equation. Since the detailed process of calculating the hydraulic drag by applying Darcy formula is well known, and the process of calculation is outside the range of the technical concept of the present invention, the detailed process thereof will not be particularly described herein.

The operation of considering the friction and the weight of the control rod 10 may work as another parameter to calculate the estimated value for the insertion time of the control rod 10.

The friction may signify a frictional force generated by a viscosity coefficient of water and a surface roughness of the inside wall of the guide tube 30 when the control rod 10 falls along the guide tube 30 filled with the water and the impact absorption tube 40. In other words, when the control rod 10 falls, the friction is generated in a direction opposite to the direction in which the control rod 10 falls, on the surface of the control rod 10 in contact with the water. Since the friction acts in the direction opposite to the falling direction of the control rod 10, the friction acts as a factor delaying the insertion time of the control rod 10. Therefore, the friction is considered to calculate an accurate estimated value.

The weight of the control rod 10 may be used to calculate the estimated value by applying the weight of the control rod 10 actually used in a real power plant as a parameter.

As described above, the simulation construction method for measurement of the control rod insertion time according to the present invention may exhibit an effect that the estimated value for the insertion time of the control rod 10 is predicted as close to the actual insertion time of the control rod 10 which actually falls in the nuclear reactor by simulating the process of the control rod 10 which freely falls from the top portion of the nuclear reactor down to the impact absorption tube 40.

As described above, the simulation construction method for measurement of the control rod insertion time according to the present invention may exhibit an effect that the accuracy of the estimated value is more enhanced by considering the hydraulic drag, the friction, and the weight of the control rod 10 as parameters for calculating the estimated value.

As described above, the simulation construction method for measurement of the control rod insertion time according to the present invention may exhibit an effect that useful information for the design and the operation of the nuclear reactor is provided by additionally obtaining the information on the drop speed of the control rod 10, the pressure distribution inside the guide tube 30 and the impact absorption tube 40, and a flow rate at the first and second flow holes 50 and 60 when the control rod 10 falls, based on the estimated value close to the actual value.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the values, it will be understood by those of ordinary skill in the art that various changes in form and details may be made therein without departing from the spirit and scope of the present invention as defined by the following claims.

The invention claimed is:

1. A method for improving design or operation of a nuclear reactor having at least one control rod that falls by gravity toward a core of the nuclear reactor, the method comprising:
    determining an actual insertion time value when the control rod falls by gravity inside the nuclear reactor;
    performing a simulation of a control rod falling by gravity toward a core of the nuclear reactor, said performing including:
        three-dimensionally modeling an inside wall of the nuclear reactor, the control rod accommodated inside the nuclear reactor, a guide tube guiding the control rod, an impact absorption tube located at the bottom of the guide tube with a diameter smaller than the diameter of the guide tube, a first flow hole located in the inside wall of the guide tube, and a second flow hole located at the bottom of the impact absorption tube;
        configuring a flow field by dividing the inside of the nuclear reactor into a plurality of cells, wherein the flow field is configured by a variable grid system comprising a plurality of variable cells having a configuration that changes as the control rod changes location in the path along which the control rod passes, and by an aligned grid system comprising a plurality of fixed cells which maintain their configuration regardless of the location change of the control rod;
        calculating a first simulation estimated value for the insertion time until the control rod is inserted into the impact absorption tube, wherein calculating the first simulation estimated value is determined by analyzing a thermal-hydraulic phenomenon using three-dimensional computational fluid dynamics (CFD) codes; and
        calculating a second simulation estimated value, wherein the second simulation estimated value is determined by changing a size of one or more of the variable cells and/or a size of one or more of the fixed cells, when the first simulation estimated value is compared with the determined actual insertion time value, and an error between the first simulation estimated value and the actual insertion time value is determined to be out of a reference range; and
    using the second simulation estimated value to change the size of the one or more variable cells and/or a size of one or more of the fixed cells, when the second simulation estimated value is compared with the determined actual insertion time value, and an error between the second simulation estimated value and the actual insertion time value is determined to be out of a reference range.

2. The method of claim 1, further comprising calculating a hydraulic drag of the control rod caused by water filling inside of the nuclear reactor when the control rod falls.

3. The method of claim 1, wherein said analyzing includes consideration of friction force between water and the control rod and weight of the control rod when the control rod falls.

4. The method of claim 1, wherein the reference range is set in such a way that the error between the estimated value and the actual value lies within 5% of the reference range.

5. The method of claim 1, wherein the thermal-hydraulic phenomenon comprises a pressure change, a temperature change, and a density change in the water around the control rod when the control rod falls.

* * * * *